United States Patent [19]

Mochida et al.

[11] Patent Number: 5,207,370
[45] Date of Patent: May 4, 1993

[54] WIRE BONDING METHOD AND APPARATUS

[75] Inventors: Tooru Mochida; Yoshimitsu Terakado; Akihiro Hirayanagi, all of Tokyo, Japan

[73] Assignee: Kabushiki Kaisha Shinkawa, Tokyo, Japan

[21] Appl. No.: 890,953

[22] Filed: May 29, 1992

[30] Foreign Application Priority Data

May 29, 1991 [JP] Japan ................... 3-153916

[51] Int. Cl.⁵ ........................ H01L 21/607
[52] U.S. Cl. .................... 228/102; 228/1.1; 228/4.5; 228/10
[58] Field of Search .......... 228/6.2, 4.5, 8, 10, 228/102

[56] References Cited

U.S. PATENT DOCUMENTS

| 5,011,061 | 4/1991 | Funatsu | 228/10 X |
| 5,060,841 | 10/1991 | Oshima et al. | 228/179 X |
| 5,121,870 | 6/1992 | Evans et al. | 228/179 X |

FOREIGN PATENT DOCUMENTS

| 177732 | 8/1986 | Japan | 228/4.5 |
| 021234 | 1/1987 | Japan | 228/4.5 |
| 64-9730 | 2/1989 | Japan | |
| 1-31695 | 6/1989 | Japan | |

Primary Examiner—Kenneth J. Ramsey
Attorney, Agent, or Firm—Koda and Androlia

[57] ABSTRACT

In a bonding method and apparatus, a vertical movement of a bonding arm holder that has a capillary at the tip end is detected by a linear sensor and data based upon such a detection is outputted by the sensor. The output date in a predetermined range is checked if it is within a permissible range. If the output data is within the permissible range, it is determined that the capillary has come into contact with a bonding surface, and such a determination can be made without being affected by noises that often occur in bonding apparatus caused by vibrations.

8 Claims, 3 Drawing Sheets

WIRE BONDING METHOD AND APPARATUS

BACKGROUND OF THE INVENTION

1. Field of the Invention

The present invention relates to a wire bonding method and apparatus and more particularly to a wire bonding method and apparatus which detects the heights or levels of bonding surfaces.

2. Prior Art

Conventional examples of wire bonding apparatuses which are capable of detecting the level of the bonding surface are disclosed in Japanese Patent Application Publication ("Kokoku") Nos. 64-9730 and 1-31695.

In these apparatuses, a tool arm which holds a capillary is attached to an arm holder, and the arm holder is swingably attached to a lifter arm. The lifter arm is mounted to a bonding head so that the lifter arm is able to move up and down or is above to swing. In addition, a gap detecting sensor is attached to the lifter arm so that the sensor faces the tool arm.

When the lifter arm is lowered, or when the lifter arm is caused to swing so that the capillary side of the lifter arm is lowered, the capillary is moved down, and the gap between the tool arm and gap detecting sensor changes. The point in time where the value of the detection output derived from the gap change has changed by a given amount from the initial value is considered as the time of contact between the capillary and the bonding surface.

In this prior art, the level or the height of the bonding surface is ascertained according to the point in time where the value of the detection output has changed by a given amount from the initial value. In other words, the level is ascertained according to a given amount of change in the absolute value of the detection output.

If vibrations occur in the lifter arm and arm holder (especially when very small vibrations occur immediately prior to the contact of the capillary with the bonding surface), and also if noise enters the gap detecting sensor, etc., the level of the bonding surface is ascertained at a point other than the correct bonding surface. As a result, detection errors occur.

Furthermore, since the gap detecting sensor is a magnetic sensor, there is a response lag relative to the threshold value of the sensor. As a result, it takes time for the magnetic sensor to detect the bonding surface after the capillary has actually contacted the bonding surface. During this time, the capillary presses the bonding wire against the bonding surface, so that the amount of crushing of the bonding wire or ball, i.e., the so-called "sink-in", becomes excessive.

SUMMARY OF THE INVENTION

The object of the present invention is to provide a wire bonding method and apparatus which is capable of detecting the level or height of the bonding surface with high precision.

A first means of the present invention to achieve the object is characterized in that in a wire bonding method wherein an arm holder that has a capillary is moved vertically or caused to swing so that a bonding wire which passes through the capillary is bonded to a bonding surface when the capillary is moved down, (a) the displacement or movement of the arm holder in a vertical direction or in a swing motion is successively detected by a linear sensor, (b) a check is made to see whether the change in output data from the linear sensor in a predetermined range is within a predetermined permissible range or not, and (c) then if such a change is within the predetermined permissible range, it is judged that the capillary has contacted the bonding surface.

A second means of the present invention to accomplish the object is characterized by the fact that in the same basic wire bonding method as in the first means, (a) the displacement or the movement of the arm holder in a vertical direction is successively detected by a linear sensor, (b) an average or sum of output data based upon the successive detection by the linear sensor in a predetermined range is determined, (c) this average or sum value is compared with another average or sum value obtained in a previously detected range, and (d) then if the difference obtained by such a comparison is within a predetermined permissible range, it is determined that the capillary has contacted a bonding surface.

The object of the present invention is also accomplished by a third means which is for a wire bonding apparatus comprising an arm holder that has a capillary and is moved vertically or caused to swing so that a bonding wire passing through the capillary is bonded to a bonding surface, and such a third means includes:

a linear sensor which detects the displacement or movement of the arm holder moved in a vertical direction or caused to swing, and a control circuit which (i) checks to see whether the change in the output data based upon the successive detection by the linear sensor in a predetermined range is within a predetermined permissible range or not, and then (ii) judges that the capillary has contacted the bonding surface if such a change is within the predetermined permissible range.

A fourth means of the present invention to achieve the object is characterized in that in a wire bonding apparatus of the same type as in the third means above, and the control circuit (i) determines the average or sum of output data obtained by the successive detection by the linear sensor in a predetermined range, (ii) compares such an average or sum with another average or sum obtained in a previous range, and (iii) then judges that the capillary has contacted the bonding surface if the difference obtained by such a comparison is within a predetermined permissible range.

In the first and third means, the level of the bonding surface is ascertained by determining whether the change in the output data of the linear sensor in a predetermined range is within a predetermined permissible range or not.

On the other hand, in the second and fourth means, the level of the bonding surface is ascertained by comparing the average or sum of the output data of the linear sensor in a predetermined range with the average or sum obtained in the previous range.

Accordingly, by setting the predetermined read-in range and the predetermined permissible range at certain values, a determination of bonding surface is accomplished without being affected by noises, and an accurate detection of the level of bonding surface can be accomplished. Furthermore, since a linear sensor is used as a gap size detecting sensor and not a magnetic sensor, the displacement or movement of the arm holder is successively read by the linear sensor; and since there is no response lag, the precision of detection is further improved.

DETAILED DESCRIPTION OF THE INVENTION

One embodiment of the present invention will be described below with reference to FIGS. 1 through 4.

Figure 1:
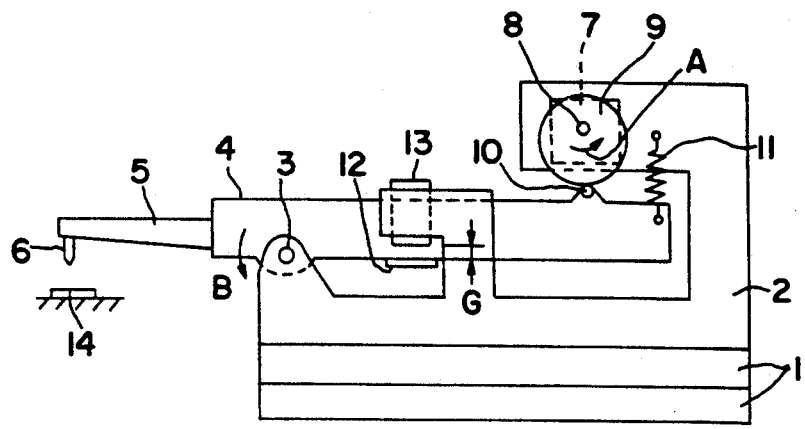
FIG. 1 is a side view of the bonding apparatus according to the present invention.

As shown in FIG. 1, a bonding head 2 is mounted on an X-Y table 1. An arm holder 4 is swingably mounted to the bonding head 2 via a rotatable supporting shaft 3. A tool arm 5 is attached to the arm holder 4, and a capillary 6 is fastened to the tip end of the tool arm 5.

A motor 7 which can make forward and reverse rotations is mounted on the bonding head 2. A cam shaft 8 is attached to the output shaft of the motor 7, and a cam 9 is fastened to the cam shaft 8.

The arm holder 4 is biased by a spring 11 so that a cam follower 10 which is a roller rotatably installed on the arm holder 4 is pressed against the cam 9.

A detection plate 12 is fastened to the undersurface of the arm holder 4. The detection plate 12 is on the opposite side of the arm holder 4 from the capillary 6, and projects outwardly over the side surface of the arm holder 4. In addition, a linear sensor 13 is attached to the bonding head 2 so as to face the upper surface of the detection plate 12.

The cam 9 is a linear or eccentric cam and has a dropping profile for a range extending through 180 degrees of forward rotation (in the direction shown by arrow A) from the state shown in FIG. 1. Thus, the cam 9 is rotatable in the forward and reverse directions through the 180-degree range. In other words, the cam 9 has a dropping profile when rotated in the reverse direction.

Figure 3:
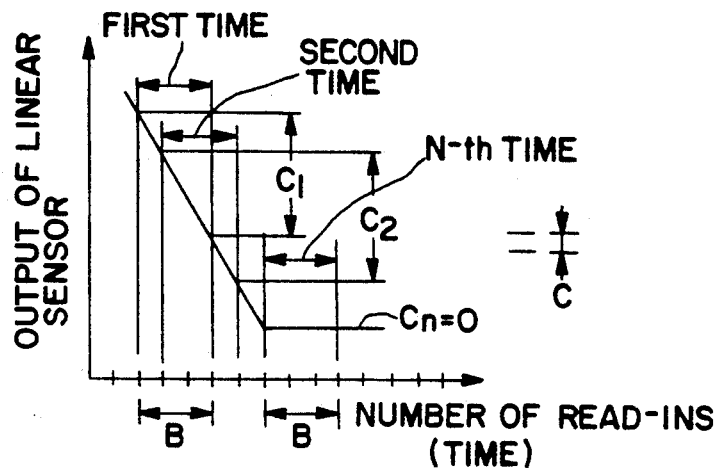
FIG. 3 is a linear sensor output diagram according to one embodiment of the bonding method of the present invention.

With the structure described above, when the cam 9 is rotated in the forward direction as indicated by arrow A, the dropping profile of the cam 9 causes the arm holder 4 to swing about the supporting shaft 3 in the direction of arrow B. As a result, the capillary 6 is lowered. In this case, the gap G between the detection plate 12 and the linear sensor 13 changes greatly in accordance with the amount of downward movement of the arm holder 4, and a voltage or current which is proportional to the size of the gap G is outputted by the linear sensor 13 as shown in FIG. 3.

After the capillary 6 is lowered and comes into contact with the workpiece 14, the change of the size of the gap G becomes minimal and then becomes zero. Accordingly, the voltage or current thereafter is constant and such a constant voltage or current is outputted by the linear sensor 13. How the output of the constant current or voltage is ascertained will be described later.

When the constant current or voltage is outputted by the linear sensor 13, such an output is judged, by a control circuit (described later), as the level of bonding surface, and a detection point thereof is stored in the memory of the control circuit. Using this detection point as a standard, the motor 7 is rotated by a predetermined amount, a gap is left between the cam 9 and cam follower 10, and a certain amount of load is applied to the capillary 6 by the force of the spring 11. As a result, the so-called "sinking in" (as is called by persons skilled in the art) occurs to the capillary 6. Then, a bonding wire (not shown) which passes through the capillary 6 is bonded to the workpiece 14, the motor 7 is rotated in the reverse direction, and then the capillary 6 is raised by the rising profile of the cam 9.

Figure 2:
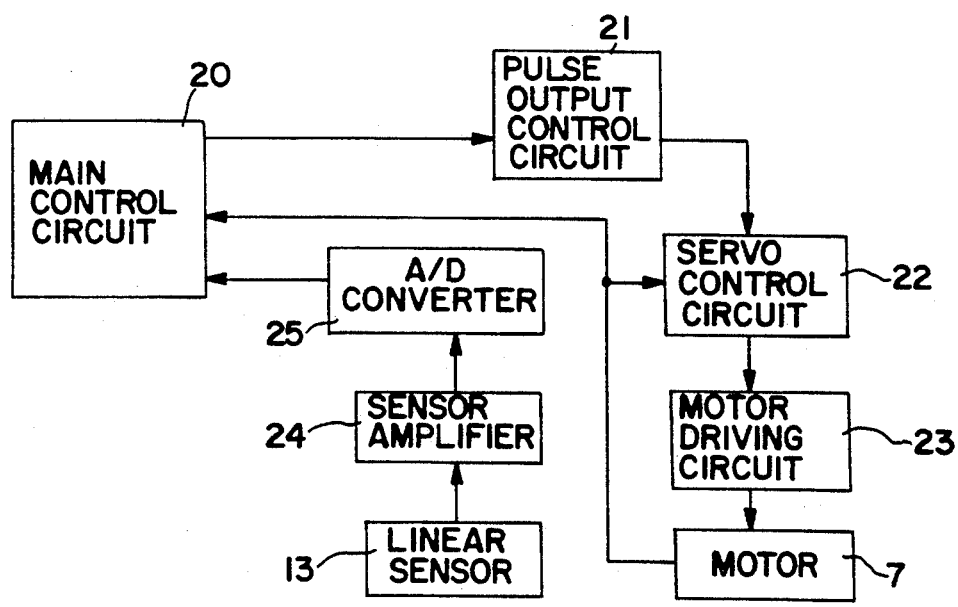
FIG. 2 is a block diagram of the driving means used in the bonding apparatus shown in FIG. 1.

FIG. 2 shows a control circuit used in the present invention.

The motor 7 is driven via a pulse output control circuit 21, servo control circuit 22 and motor driving circuit 23 on the basis of data stored beforehand in a main control circuit 20. The amount of forward rotation and amount of reverse rotation of the motor 7 are controlled by these circuits. The rotational position of the motor 7 in this case is read into the main control circuit 20 and the servo control circuit 22.

The output of the linear sensor 13 during the lowering motion of the capillary 6 by the rotation of the motor 7 as described above is successively amplified by a sensor amplifier 24, converted into digital data by A/D converter 25 and then inputted into the main control circuit 20.

In the main control circuit 20, a predetermined read-in time range and a predetermined permissible range are established. These ranges are shown in FIG. 3. More specifically, the predetermined read-in range is a range wherein output data, which are obtained by reading the output of the linear sensor 13, are read in for a predetermined number of times. The predetermined read-in range is referred to as B in FIG. 3. On the other hand, the predetermined permissible range is a predetermined range which is to be compared with output changes that occur in each of the predetermined read-in ranges B. The predetermined permissible range is referred to as C and the output changes are referred to as C1, C2 ... Cn in FIG. 3.

If the output (which is derived from the gap change between the sensor 13 and the detection plate 12) of the linear sensor 13 changes as shown in FIG. 3, such an output change in the predetermined read-in range B for the first time is C1. Since this output change C1 is larger than the predetermined permissible range C (shown in FIG. 3), the main control circuit 20 judges that the level of the bonding surface has not been reached; in other words, the main control circuit 20 determines that the capillary has not yet contacted the bonding surface.

In the second time predetermined read-in range B and so on, the same judgment as for the first range B is made, which is that the level of the bonding surface has not been reached, because the output changes C2 and so on are larger than the predetermined permissible range C.

Then, in the n-th time predetermined read-in range B, the output change Cn (in the case of FIG. 3, Cn is zero (Cn=0), i.e., no output change) is smaller than the predetermined permissible range C; accordingly, the main control circuit 20 judges that the level of the bonding surface has been reached; in other words, it is found that the capillary has contacted the bonding surface.

When the main control circuit 20 thus judges that the level of the bonding surface has been reached (or the capillary has contacted the bonding surface), the output data from the linear sensor 13 at that time is stored in the memory of the main control circuit 20 as data representing the level or the height of the bonding surface. Then, using the thus obtained bonding surface detection point as a standard level, the amount of rotation of the motor 7 is controlled accordingly so that the sinking-in of the capillary 6 and the raising of the capillary 6 after the bonding, etc., are determined.

The output of the linear sensor 13 cannot actually be expressed by a straight line as shown in FIG. 3. The output contains noises (represented by curves 30 and 31) which are caused by vibrations, etc. as shown in FIG. 4.

Figure 4A:
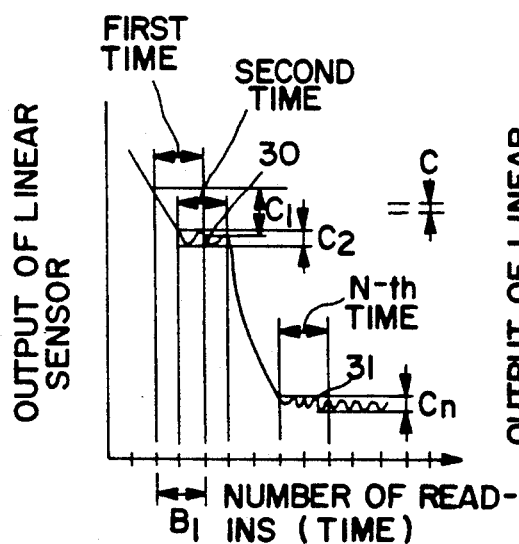
FIGS. 4(a) and 4(b) are linear sensor output diagrams according to one embodiment of the bonding method of the present invention in a case where noise is generated.

In this case, if the predetermined read-in range is set at a smaller value as shown by B1 in FIG. 4(a), the corresponding output change C2 becomes smaller than the predetermined permissible range C. This, however, would cause an erroneous detection of the bonding surface in the following comparison between the output change and the permissible range because of the noise 30. Accordingly, the predetermined read-in range is set as indicated by B2 in FIG. 4(b), which is larger than B1; as a result, the output change C2 becomes larger than the predetermined permissible range C even though the noise 30 is present. As seen from the above, by setting a larger read-in range, the noise 30 can be ignored, and no erroneous detection of the bonding surface occurs.

Figure 4B:
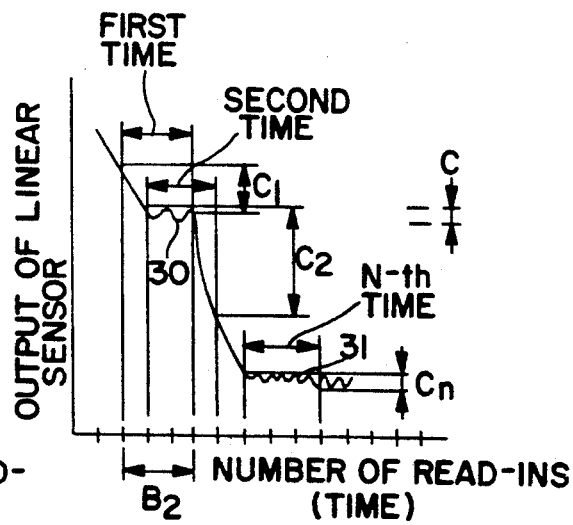

On the other hand, if the predetermined permissible range C is set at a smaller value as shown in FIG. 4(a), then the output change Cn in the "output change to permissible range" comparison becomes larger than the predetermined permissible range C due to the noise 31, despite the fact that the capillary has already contacted the bonding surface. As a result, the bonding surface is not able to be detected properly. In this case, the predetermined permissible range C is set at a larger value than the noises 30 and 31 as shown in FIG. 4(b), then the noises can be ignored, and no erroneous detection occurs.

In bonding apparatuses, noises generally have a maximum value of certain level. Accordingly, it is necessary to examine the magnitude of the noises beforehand through tests so that the predetermined read-in range B and predetermined permissible range C are able to be set on the basis of such test results.

In the embodiment described above, each of the output changes C1, C2, ... Cn are measured for each predetermined read-in range B and then compared with the predetermined permissible range C. However, it is possible to use another way of comparison. More specifically, the average or sum of the output data in each predetermined read-in range B is first obtained, and then they are compared in such a manner that the average or sum obtained in the second range B is compared with that obtained in the first range B, the average or sum of output data in the third range is compared with that for the second range, and so on so that the n-th time read-in range B is compared with the n-th time −1 (n-th time minus 1) read-in range B. In this comparison method, the level of the bonding surface is judged to have been reached (or it is found that the capillary has contacted the bonding surface) if the difference obtained by such comparisons is within the predetermined permissible range C.

Figure 5:
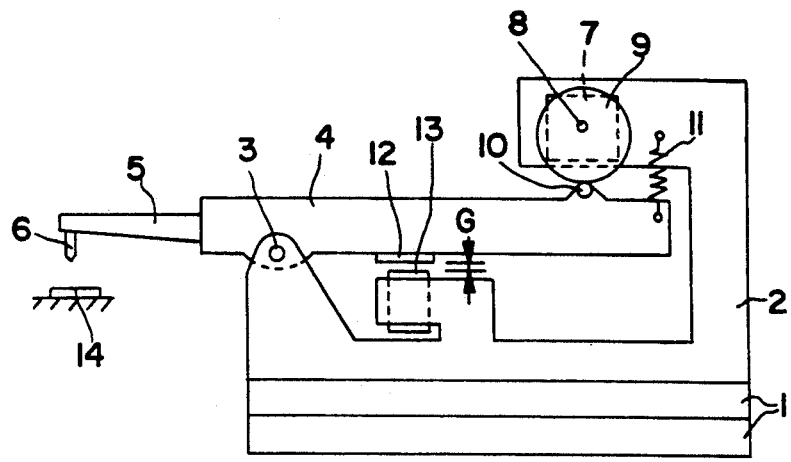
FIG. 5 is a side view of another embodiment of the bonding apparatus according to the present invention.
Figure 6:
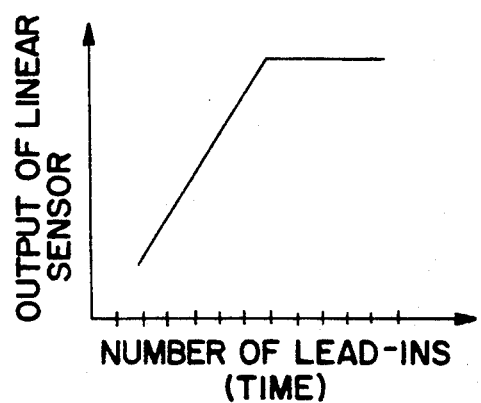
FIG. 6 is a diagram of the linear sensor output in the case of FIG. 5.

In the embodiment described above, the linear sensor 13 is installed so as to face the upper surface of the detection plate 12. However, the linear sensor 13 can be mounted to the bonding head 2 to face the under surface of the detection plate 12 as shown in FIG. 5. If the sensor is installed this way, the output of the linear sensor 13 increases or changes as shown in FIG. 6 when the capillary 6 is lowered, and then after the capillary has come into contact with the workpiece 14, the output shows no change. Detection in the same manner as in the previously described embodiment is accomplished in the structure shown in FIG. 5.

In addition, according to the embodiment shown in FIG. 1, the arm holder 4 is mounted to the bonding head 2 via the supporting shaft 3 so that the arm holder 4 is free to swing. However, the arm holder 4 can be mounted swingably to the bonding head 2 via a plate spring (not shown). Furthermore, the arm holder 4 shown in FIGS. 1 and 5, respectively, is swingable about the shaft 3; however, it can be moved up and down keeping its horizontal position instead of moving swingably.

As seen from the above, according to the present invention, the level or the height of the bonding surface can be detected without being affected by noise, and it is possible to accomplish high-precision detection.

We claim:

1. A wire bonding method in which an arm holder that has a capillary is moved up and down so that a bonding wire which passes through said capillary is bonded to a bonding surface, said method comprising (a) successively detecting a displacement of said arm holder in said up and down movement by a linear sensor, (b) determining whether a change in output data supplied from said linear sensor based upon said detected displacement in a predetermined read-in range are within a predetermined permissible range or not, so that if said change is within said predetermined permissible range, said capillary is judged to have contacted said a bonding surface.

2. A wire bonding method in which an arm holder that has a capillary is moved up and down so that a bonding wire which passes through said capillary is bonded to a bonding surface, said method comprising (a) successively detecting a displacement of said arm holder in said up and down movement by a linear sensor, (b) successively determining an average or sum of output data supplied from said linear sensor in a predetermined read-in range, (c) comparing said average or sum with an average or sum in a previous predetermined read-in range, so that when a difference obtained by said comparison is within a predetermined permissible range, said capillary is judged to have contacted said bonding surface.

3. A wire bonding method according to claim 1 or 2, wherein said up and down movement of said arm holder is brought by a vertical movement of said arm holder while keeping said arm holder horizontal.

4. A wire bonding method according to claim 1 or 2, wherein said up and down movement of said arm holder is brought by a swing motion of said arm holder which is made about a support shaft.

5. A wire bonding apparatus in which an arm holder that has a capillary is moved up and down so that a bonding wire which passes through said capillary is bonded to a bonding surface, said apparatus comprising:

a linear sensor which detects a displacement of said arm holder in said up and down movement, and a control circuit which (i) checks to see whether a change in output data supplied from said linear sensor based upon said detected displacement in a predetermined read-in range are within a predetermined permissible range or not, so that if said change is within said predetermined permissible range, said capillary is judged to have contacted said bonding surface.

6. A wire bonding apparatus in which an arm holder that has a capillary is moved up and down so that a bonding wire which passes through said capillary is bonded to a bonding surface, said apparatus comprising:

a linear sensor which detects a displacement of said arm holder in said up and down movement, and a control circuit which (i) determines an average or sum of output data supplied from said linear sensor based upon said detected displacement within a predetermined read-in range, (ii) comparers said average or sum with an average or sum in a previous predetermined read-in range, and (iii) judges that said capillary has contacted a bonding surface when a difference obtained by said comparison is within a predetermined permissible range.

7. A wire bonding apparatus according to claim 5 or 6 wherein said up and down movement of said arm holder is brought by a vertical movement of said arm holder while keeping said arm holder horizontal.

8. A wire bonding apparatus according to claim 5 or 6 wherein said up and down movement of said arm holder is brought by a swing motion of said arm holder which is made about a support shaft.

* * * * *